United States Patent
Fischer et al.

(10) Patent No.: US 7,064,999 B2
(45) Date of Patent: Jun. 20, 2006

(54) DIGITAL MEMORY CIRCUIT HAVING A PLURALITY OF MEMORY BANKS

(75) Inventors: Helmut Fischer, Oberhaching (DE);
Ullrich Menczigar, Vaterstetten (DE);
Johann Pfeiffer, Ottobrunn (DE)

(73) Assignee: Infineon Technologies AG, Munich (DE)

(*) Notice: Subject to any disclaimer, the term of this patent is extended or adjusted under 35 U.S.C. 154(b) by 676 days.

(21) Appl. No.: 10/342,901

(22) Filed: Jan. 15, 2003

(65) Prior Publication Data

US 2004/0088613 A1  May 6, 2004

(30) Foreign Application Priority Data

Jan. 15, 2002  (DE) ................................ 102 01 179

(51) Int. Cl.
*G11C 8/00* (2006.01)

(52) U.S. Cl. ............................ 365/230.04; 365/230.03; 714/710

(58) Field of Classification Search ............ 365/230.04, 365/230.03; 714/710
See application file for complete search history.

(56) References Cited

U.S. PATENT DOCUMENTS

| | | | |
|---|---|---|---|
| 4,482,984 A | * | 11/1984 | Oritani ........................ 365/154 |
| 6,337,830 B1 | * | 1/2002 | Faue ....................... 365/230.04 |
| 2001/0034819 A1 | | 10/2001 | Nicosia et al. |

\* cited by examiner

*Primary Examiner*—Richard Elms
*Assistant Examiner*—Eric J. Wendler
(74) *Attorney, Agent, or Firm*—Laurence A. Greenberg; Werner H. Stemer; Ralph E. Locher

(57) ABSTRACT

A digital memory circuit has at least two pairs of adjacent memory banks. Each of the banks has n parallel terminals for n read/write data lines. Each bank pair has only two bundles of n/2 read/write data lines. A first bundle is assigned to the first half of a first bank and to a second half of a second bank and the second bundle is assigned to a second half of the first bank and to a first half of the second bank. Data are input/output in parallel to n/2 input/output lines with the timing of successive half-periods of a clock signal. A changeover device is changeable between different switching states for connecting a bundle of n/2 input/output lines to the read/write data lines of the bank pair containing the addressed bank, depending on whether the data are assigned to the first or second half-period of the clock signal.

6 Claims, 3 Drawing Sheets

DIGITAL MEMORY CIRCUIT HAVING A PLURALITY OF MEMORY BANKS

BACKGROUND OF THE INVENTION

FIELD OF THE INVENTION

The invention relates to a digital memory circuit that contains at least one pair of adjacent memory banks and can be operated with a double data rate. In the case of integration on a semiconductor chip, known memory circuits of this generic type require a relatively large distance between the adjacent banks in order to lead the read/write data lines from the banks to a central bank multiplexer which connects the lines to the central data lines of the chip. This is a problem because it imposes limits for miniaturization. The present invention is intended to solve this problem.

SUMMARY OF THE INVENTION

It is accordingly an object of the invention to provide a digital memory circuit having a plurality or memory banks that overcomes the above-mentioned disadvantages of the prior art devices of this general type, in which the space requirement for the configuration of the memory banks in the case of a memory circuit that is provided with a plurality of memory banks and is to be operated with a double data rate, is minimized.

With the foregoing and other objects in view there is provided, in accordance with the invention, a digital memory circuit. The memory circuit contains at least two pairs of adjacent banks having in each case a multiplicity of memory cells in each of the banks. The memory cells form a matrix-type configuration of rows and columns and receive and are addressed by bank address signals, row address signals and column address signals. Only two bundles of in each case n/2 read/write data lines are connected to each pair of the adjacent banks. The two bundles of n/2 read/write data lines include a first bundle connected to a first half of a first bank and to a second half of a second bank and a second bundle connected to a second half of the first bank and to a first half of the second bank. The bundles of the n/2 read/write data lines are coupled to the columns of different halves of a bank in order to be able to write in or read out at each bank half simultaneously n/2 data bits at n/2 simultaneously addressed columns. A bundle of n/2 input/output lines are provided for inputting and outputting n/2 data bits in parallel form. A control device receives and responds to the bank address signals, the row address signals, the column address signals and a clock signal for producing data transfer paths between simultaneously addressed memory cells and assigned ones of the n/2 read/write data lines during a respective period of the clock signal. A changeover device is controlled in a manner dependent on the clock signal to connect the n/2 input/output lines to the n/2 read/write data lines coupled to the first half of an addressed bank during a first half-period of the clock signal and to the n/2 read/write data lines coupled to the second half of the addressed bank during a subsequent second half-period of the clock signal. The changeover device is changed over between different switching states to connect the n/2 input/output lines either to the first bundle or to the second bundle of n/2 the read/write data lines of at least a bank pair containing the addressed bank.

Accordingly, the invention is realized by a digital memory circuit that contains at least two pairs of adjacent banks having in each case a multiplicity of memory cells in each bank. The memory cells form a matrix-type configuration of rows and columns and can be addressed by bank address signals, row address signals and column address signals. Connected to each bank are two bundles of in each case n/2 read/write data lines which are assigned to the columns of different halves (even, odd) of the bank in order to be able to write in or read out at each bank half simultaneously n/2 data bits at n/2 simultaneously addressed columns. The memory further has a bundle of n/2 input/output lines for inputting and outputting n/2 data bits in parallel form. A control device is provided, which responds to the bank address signals, the row address signals, the column address signals and a clock signal in order to produce data transfer paths between simultaneously addressed memory cells and assigned read/write data lines during a respective period of the clock signal. A changeover device is provided, which can be controlled in a manner dependent on the clock signal in order to connect the n/2 input/output lines to the read/write data lines assigned to the first half of the addressed memory bank during a first half-period of the clock signal and to the read/write data lines assigned to the second half of the addressed memory bank during the subsequent second half-period of the clock signal. According to the invention, there are provided for each pair of adjacent banks only in each case two bundles of in each case n/2 read/write data lines, the first bundle of which is assigned to the first half (even) of one bank and to the second half (odd) of the other bank and the second bundle of which is assigned to the second half of one bank and to the first half of the other bank, and in that the changeover device can be changed over between different switching states in order to connect the input/output lines either to the first bundle or to the second bundle of the read/write data lines of at least the bank pair containing the addressed bank.

Thus, in the memory circuit according to the invention, the number of read/write data lines for each pair of adjacent banks is only half as large as in the prior art, so that the chip area required for the routing of the read/write data lines between the adjacent banks is smaller and the banks can be situated closer to one another. This allows a miniaturization of the chip.

In a first embodiment of the invention, the changeover device contains a central n/2-pole changeover switch, which connects the input/output lines to a first bundle of n/2 central data lines in a first switching state and connects the input/output lines to a second bundle of n/2 central data lines in a second switching state. For each-bank pair a separately assigned n-pole changeover switch, which can be controlled in a manner dependent on the bank addressing in such a way that it connects the first bundle of the central data lines to the first bundle of the read/write data lines of the addressed bank and simultaneously connects the second bundle of the central data lines to the second bundle of the read/write data lines of the addressed bank. A changeover control device is provided, which responds to the clock signal in order to put the first changeover switch into the first switching state during the first half-period of the clock signal and into the second switching state during the subsequent second half-period of the clock signal.

In a second, alternative embodiment of the invention, the changeover device contains a central n/2-pole changeover switch, which connects the input/output lines to a first bundle of n/2 central data lines in a first switching state and connects the input/output lines to a second bundle of n/2 central data lines in a second switching state. A first connecting device is provided for connecting the first bundle of the central data lines to the first bundle of the read/write data lines of at least the bank pair containing the addressed bank. A second connecting device connects the second bundle of the central data lines to the second bundle of the read/write data lines of at least the bank pair containing the addressed bank. A changeover control device is provided, which responds to the clock signal and the column addressing at the respectively addressed bank in order to put the central changeover switch into the first switching state during the first half-period of the clock signal if the addressed column is located in a first bank half, and into the second state if the addressed column is located in a second bank half, and in order to change over the central changeover switch into the respective other switching state during the second half-period of the clock signal.

Other features which are considered as characteristic for the invention are set forth in the appended claims.

Although the invention is illustrated and described herein as embodied in a digital memory circuit having a plurality of memory banks, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
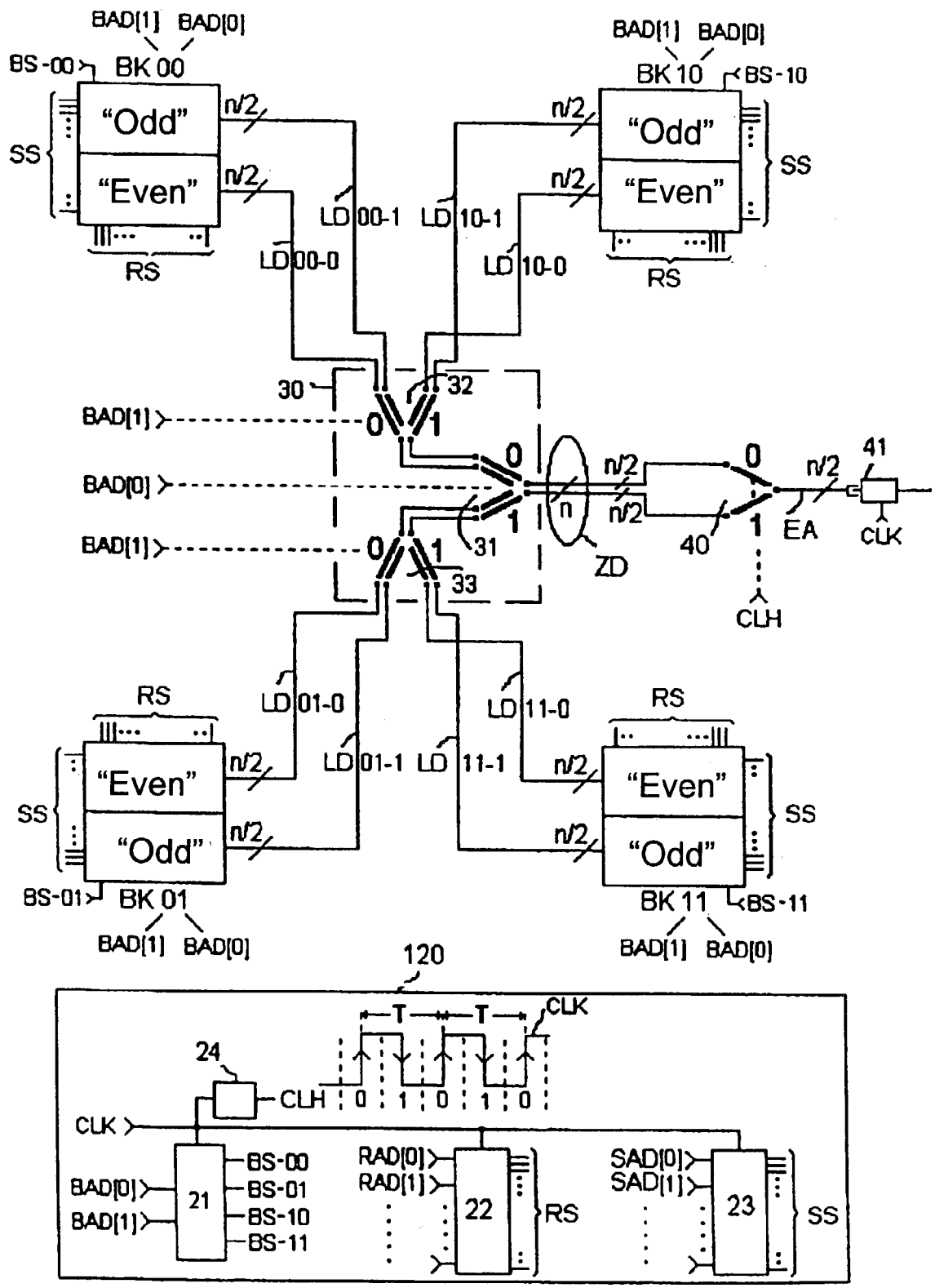
FIG. 1 is a block diagram of an example of a memory circuit according to the prior art.

Referring now to the figures of the drawing in detail and first, particularly, to FIG. 1 thereof, there is shown the construction of a RAM memory circuit operated with a double data rate (DDR-DRAM) according to the prior art. The memory circuit contains four banks, each of which is designated by the combination of letters BK and a post-fixed combination of two binary numbers representing the binary address of the relevant bank. Each of the four banks BK00, BK01, BK10 and BK11 contains a large multiplicity of binary memory cells that form a matrix containing tows and columns. The memory circuit furthermore contains a control device 120 with a bank address decoder 21, a row address decoder 22 and a column address decoder 23.

Both the individual banks BK00 to BK11 and the rows and columns within each bank are selectively addressable in each case in order to select a desired memory cell for writing in or reading out a binary datum. A bank BK is addressed by activation of an assigned bank selection control line BS by the bank address decoder 23 in a manner dependent on a bank address BAD. A row is addressed by activation of an assigned row selection control line RS by the row address decoder 21 in a manner dependent on a digital row address RAD. A column is addressed by activation of column selection control rows SS by the column address decoder 22 in a manner dependent on a column address SAD, in order to through-connect a data transfer path between the column defined by the address and a read/write data line.

A plurality of n read/write data lines LD are provided at each bank BK in order to be able to write or read data simultaneously at n different columns of a bank BK. The set of n read/write data lines LD at each bank BK is divided into two subsets, each containing a bundle of n/2 lines, and each of the bundles is permanently assigned to a dedicated half of the relevant bank. For discrimination purposes, one bank half is designated as "even half" and the other bank half as "odd half". Each of the above-mentioned bundles of in each case n/2 read/write data lines is designated by the combination of letters LD and a post-fixed combination of three binary numbers, the first two of which designate the address of the relevant bank BK and the last of which designates the respectively assigned bank half, "0" denoting "even" and "1" denoting "odd".

The column address decoder 23 is configured in such a way that it simultaneously addresses a group of n/2 columns of the even bank half and a group of n/2 columns of the odd bank half. The addressing and the writing or reading of data at the banks BK are affected with the timing of the periods of a clock signal CLK with frequency f. In other words, within each clock period of duration T=1/f, a bank, a row and a group of n/2 columns in each half of the bank are addressed by the address decoders 21, 22 and 23, and, via the read/write data lines LD of the addressed bank, data are written or read simultaneously at the memory cells which are situated in the addressed row at the positions of the addressed columns. The read/write data lines LD of each bank BK can be connected to a bundle of n central data lines ZD via a bank multiplexer 30.

The inputting or outputting of the data at the memory circuit is affected via a bundle of n/2 parallel input/output lines EA with doubled clock frequency. For this purpose, the input/output lines EA are connected to an input/output circuit 41, which is clocked both with the rising and with the falling edge of the clock signal CLK. In other words, for the simultaneous writing of n data at an addressed bank BK, a set of n/2 parallel data bits is in each case passed onto the n/2 parallel input/output lines EA both in the event of the rising edge and in the event of the falling edge of the clock signal CLK. Thus, within a clock period T, a total of n data bits appear, divided into two temporally succeeding subsets, one of which is assigned to the rising clock edge and the other of which is assigned to the falling clock edge. For their part, these two subsets of in each case n/2 data bits must be unambiguously assigned to the two LD bundles of the relevant bank BK.

In order to produce this assignment, an n/2-pole changeover switch 40 is provided, which connects the bundle of the n/2 input/output lines EA to a first half of the n central data lines ZD in a first switching state and to the second half of the n central data lines ZD in a second switching state. The bank multiplexer 30 is configured in such a way that, under the control of the bank address bits BAD[0:1], it connects the first half of the data lines ZD to that LD bundle which is assigned to the even half of the respectively addressed bank BK, and connects the other half of the data lines ZD to that LD bundle which is assigned to the odd half of the respectively addressed bank BK.

For the purpose of illustration, the n/2-pole changeover switch 40 is represented symbolically in the drawing as a mechanical changeover switch whose pivotable arm is depicted as a thick bar that symbolizes n/2 parallel individual arms. Three changeover switches 31, 32 and 33 are depicted in a similar manner in the bank multiplexer 30, although they have twice the number of poles, that is to say are n-pole and thus contain n parallel individual arms, represented by two parallel thick bars, each of which symbolizes n/2 parallel individual arms. Each of the changeover switches 40 and 31–33 can be controlled by a binary control signal in each case, symbolized by a control line depicted by dashes. If the control signal has the binary value (logic value) "0", then the multipole switching arm of the relevant changeover switch assumes the position designated by "0" (0 position). If the control signal has the logic value "1", then the multipole switching arm of the relevant changeover switch assumes the position designated by "1" (1 position).

The changeover switch 40 is controlled by a "clock half" signal CLH, which is derived from the clock signal CLK by a signal transmitter 24 in the control device 120, in such a way that it goes to "0" before each rising clock edge and goes to "1" before each falling clock edge. The changeover switch 31 in the bank multiplexer 30 is controlled by the less-significant bit BAD[0] of the bank address, so that it goes into the 0 position if one of the two upper banks BK00 or BK10 is addressed, and goes into the 1 position if one of the two lower banks BK01 or BK11 is addressed. The changeover switches 32 and 33 in the bank multiplexer 30 are controlled by the more-significant bit BAD[1] of the bank address, so that they go into the 0 position if one of the two left-hand banks BK00 or BK01 is addressed, and go into the one position if one of the two right-hand banks BK10 or BK11 is addressed.

The configuration and control of the changeover switches 40 and 31–33 shown has the effect that, in the event of a rising clock edge, precisely that LD bundle which is assigned to the even half of the addressed bank BK is connected to the n/2 input/output lines EA, and that, in the event of a falling clock edge, precisely that LD bundle which is assigned to the odd half of the addressed bank BK is connected to the n/2 input/output lines EA. Consequently, data which have been input on the input/output lines EA in the write mode in the event of a rising clock edge and have thus been written to an even bank half are also output on the input/output lines EA in the read mode only in the event of a rising clock edge. In the same way, data which have been input on the input/output lines EA in the write mode in the event of a falling clock edge and have thus been written to an odd bank half are also output on the input/output lines EA in the read mode only in the event of a falling clock edge. Table 1 below illustrates the assignment between the clock edges, the bank address, the changeover switch positions and the bank halves which is produced by the circuit according to FIG. 1:

TABLE 1

| Clock edge | Rising | Falling | Rising | Falling | Rising | Falling | Rising | Falling |
|---|---|---|---|---|---|---|---|---|
| Switch 40 | 0 | 1 | 0 | 1 | 0 | 1 | 0 | 1 |
| Bank address | 00 | 00 | 01 | 01 | 10 | 10 | 11 | 11 |
| Switch 31 | 0 | 0 | 1 | 1 | 0 | 0 | 1 | 1 |
| Switches 32, 33 | 0 | 0 | 0 | 0 | 1 | 1 | 1 | 1 |
| Connection between EA and: | LD000 | LD001 | LD010 | LD011 | LD100 | LD101 | LD110 | LD111 |
| Writing or reading to: | BK00 even | BK00 odd | BK01 even | BK01 odd | BK10 even | BK10 odd | BK11 even | BK11 odd |

In the case of the memory circuit according to FIG. 1 in each case four bundles of in each case n/2 read/write data lines LD have to be fed to the bank multiplexer 30 from each pair of adjacent banks. They are the four LD bundles LD00-0, LD00-1, LD10-0 and LD10-1 in the case of the upper bank pair BK00, BK10, and they are the four LD bundles LD01-0, LD01-1, LD11-0 and LD11-1 in the case of the lower bank pair BK01, BK11. In integrated memory circuits, these line bundles have to run between the banks, so that relatively large interspaces are necessary between adjacent banks. This is at odds with the desire for the smallest possible chip area.

Figure 2:
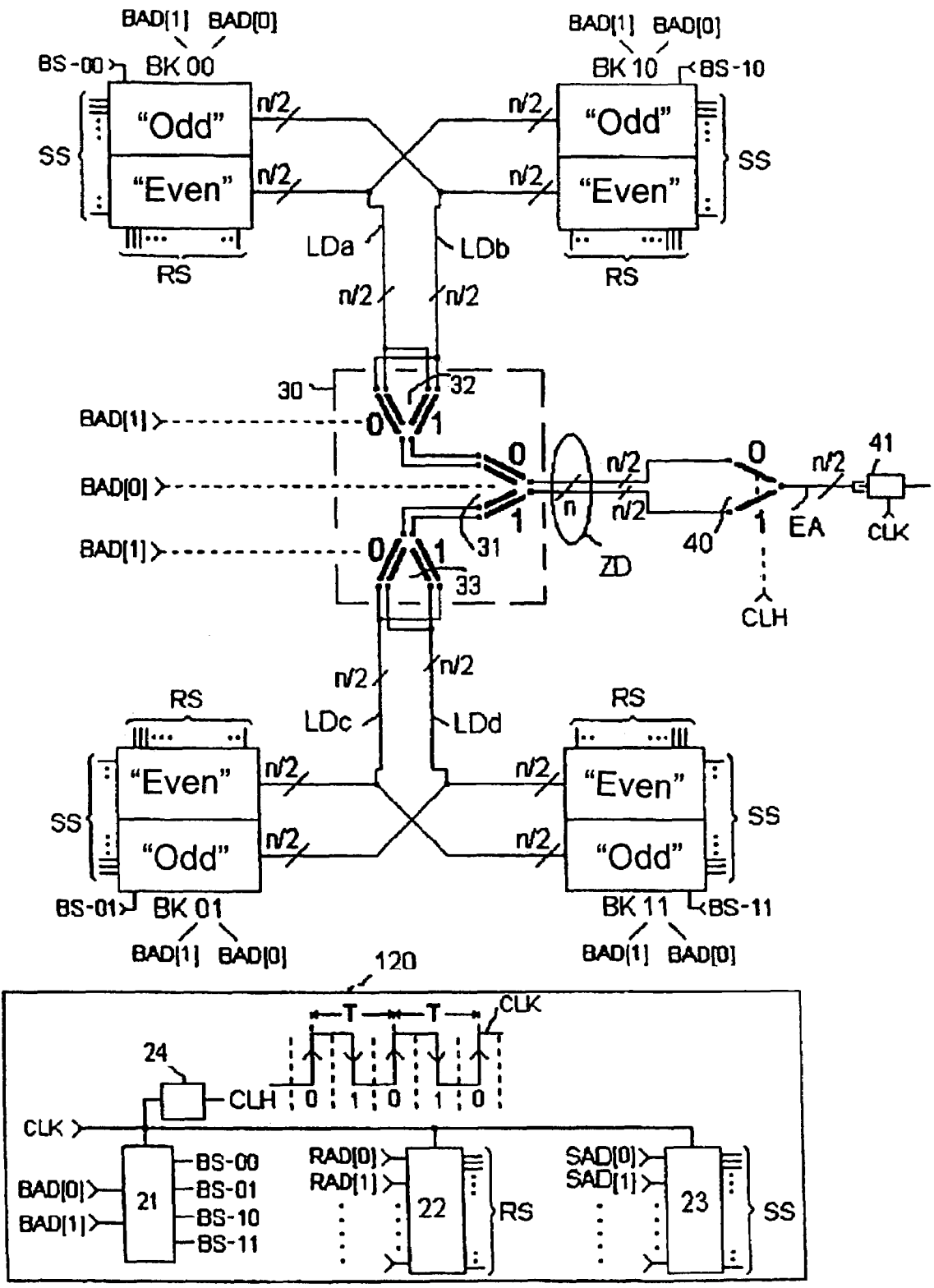
FIG. 2 is a block diagram of a memory circuit in accordance with a first embodiment of the invention.

The memory circuit according to the invention shown in FIG. 2 contains, in the same way as the memory circuit according to FIG. 1, the four memory banks BK00 to BK11, the control device 120, the bank multiplexer 30 with three n-pole changeover switches 31, 32 and 33, n central data lines ZD, the n/2-pole changeover switch 40 and the bundle of n/2 input/output lines EA. All these elements are configured in the same way and controlled in the same way as has been described above in conjunction with FIG. 1. Only the way in which the read/write data lines LD are connected to the banks BK and the connection of these lines to the changeover switches 32 and 33 are different than in FIG. 1.

In the memory circuit according to FIG. 2, the even half of the bank BK00 is connected to the same bundle LDa of n/2 read/write data lines as the odd half of the bank BK10, and the odd half of the bank BK00 is connected to the same bundle LDb of n/2 read/write data lines as the even half of the bank BK10. In a similar manner, the even half of the bank BK01 is connected to the same bundle LDc of n/2 read/write data lines as the odd half of the bank BK11, and the odd half of the bank BK01 is connected to the same bundle LDd of n/2 read/write data lines as the even half of the bank BK11.

The LD bundles LDa, LDb, LDc and LDd are connected to the terminals of the n-pole changeover switches 32 and 33 of the bank multiplexer 30 in such a way that, in combination with the control of the changeover switches 31, 32, 33 in the bank multiplexer 30 and of the changeover switch 40, the assignment illustrated in Table 2 below is produced between the clock edges and the data connection for reading and writing at the banks:

TABLE 2

| Clock edge | Rising | Falling | Rising | Falling | Rising | Falling | Rising | Falling |
|---|---|---|---|---|---|---|---|---|
| Switch 40 | 0 | 1 | 0 | 1 | 0 | 1 | 0 | 1 |
| Bank address | 00 | 00 | 01 | 01 | 10 | 10 | 11 | 11 |
| Switch 31 | 0 | 0 | 1 | 1 | 0 | 0 | 1 | 1 |
| Switches 32, 33 | 0 | 0 | 0 | 0 | 1 | 1 | 1 | 1 |
| Connection between EA and: | LDa | LDb | LDc | LDd | LDb | LDa | LDd | LDc |
| Writing or reading to: | BK00 even | BK00 odd | BK01 even | BK01 odd | BK10 even | BK10 odd | BK11 even | BK11 odd |

As can be seen from FIG. 2 and Table 2, the input/output lines EA are connected, in the event of a rising clock edge, both to the even half of the respectively addressed bank BK (e.g. BK00) and to the odd half of the respective adjacent bank (e.g. BK10) (e.g. via the LD bundle LDa). In the event of a falling clock edge, the input/output lines EA are connected both to the odd half of the addressed bank (e.g. BK00) and to the even half of the adjacent bank (e.g. BK10) (e.g. via the LD bundle LDb). No read or write mode takes place at the respective adjacent bank, however, because this bank is not addressed, that is to say is not activated via the assigned bank selection control line BS. It is thus ensured that data which have been input on the input/output lines EA in the write mode in the event of a rising clock edge and have thus been written to an even bank half are also output on the input/output lines EA in the read mode only in the event of a rising clock edge. In the same way, it is ensured that data which have been input on the input/output lines EA in the write mode in the event of a falling clock edge and have thus been written to an odd bank half are also output on the input/output lines EA in the read mode only in the event of a falling clock edge.

In comparison with the known memory circuit according to FIG. 1, in the case of the embodiment according to the invention according to FIG. 2, the number of read/write lines LD to be fed to the bank multiplexer 30 is reduced to half because two adjacent banks in each case jointly utilize the same read/write data lines. This technique of "doubly utilized" read/write data lines thus reduces the distance which has to be maintained between the adjacent banks BK00 and BK10 and between the adjacent banks BK01 and BK11 in order to accommodate the read/write data lines LD.

In the case of the embodiment according to FIG. 2, the outlay on circuitry and thus the space requirement of the bank multiplexer 30 is just as large as in the case of the memory circuit according to FIG. 1. It is desirable to reduce this space requirement as well, in order to be able to reduce the distance between the banks BK even further. This is achieved by an alternative embodiment of the invention, as is represented as an example in FIG. 3.

Figure 3:
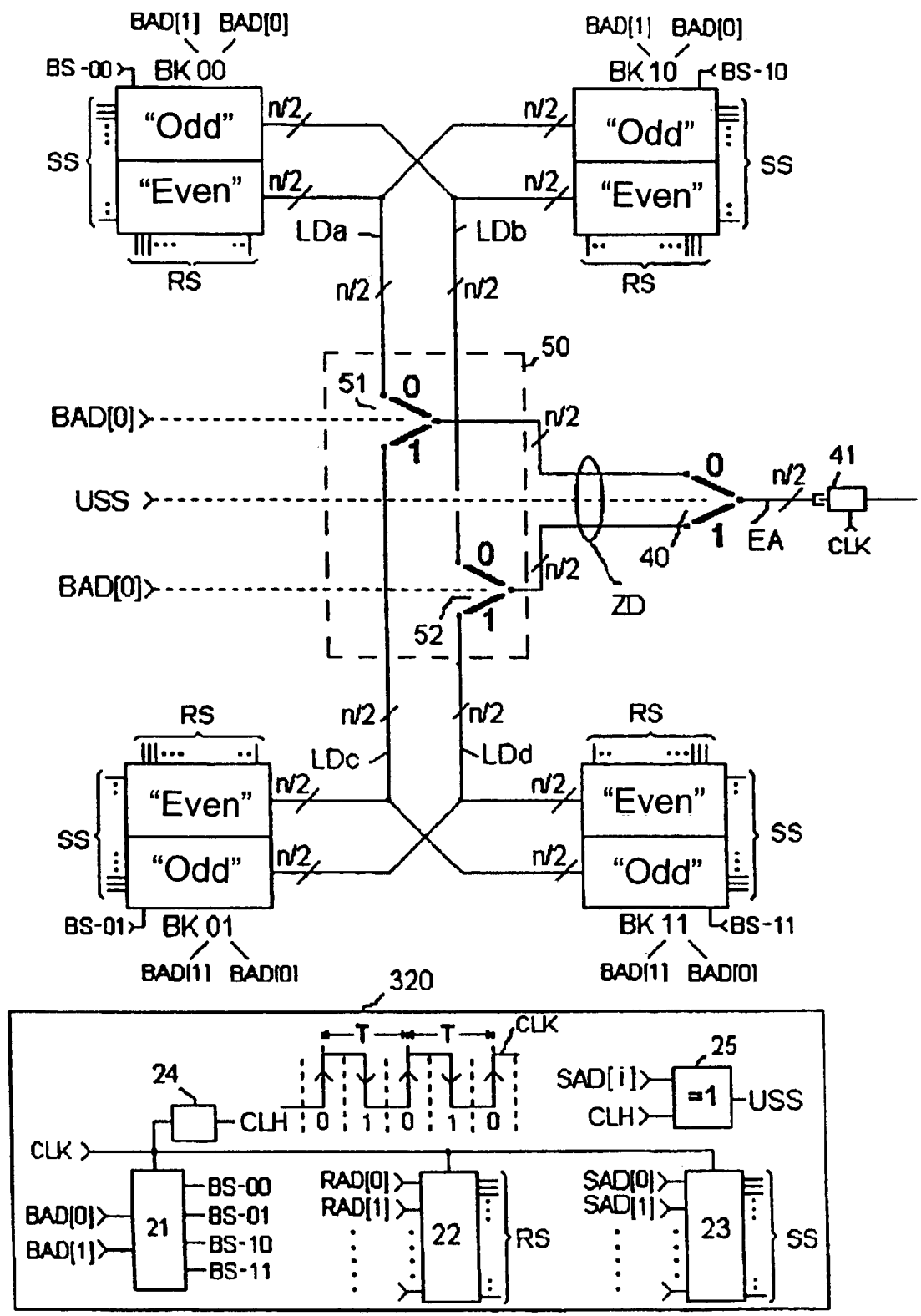
FIG. 3 is a block diagram or the memory circuit in accordance with a second embodiment of the invention.

The memory circuit shown in FIG. 3 differs from the memory circuit according to FIG. 2 in that the bank multiplexer 30 is replaced by a significantly simpler bank multiplexer 50, and in that the n/2-pole changeover switch 40 is not controlled by the binary clock half signal CLH but rather by a binary switching signal USS, which is generated by a combination circuit 25 in the control device 320 by logically combining the clock half signal CLH with an item of information which indicates whether the respectively addressed column is located in the even half or in the odd half of the addressed memory bank. All other parts of the memory circuit according to FIG. 3 are configured in precisely the same way and controlled in the same way as the parts of the memory circuit according to FIG. 2 which are designated by identical reference numerals.

The combination circuit 25 is configured in such a way that it drives the switching signal USS to the logic value "0" and thus brings the changeover switch 40 to the 0 position precisely when the clock half signal CLH has the logic value "0" and a column in the even bank half is addressed. The combination circuit 25 drives the switching signal USS to the logic value "1" and thus brings the changeover switch 40 to the 1 position precisely when the clock half signal CLH has the logic value "1" and a column in an odd bank half is addressed. The information regarding whether the addressed column is located in the even half or in the odd half of the addressed memory bank, that is to say a binary "even/odd information item", can be derived directly from the column address SAD and the respectively valid bank address BAD.

If the relationship between column address and bank half is the same for all the banks, the column address SAD alone suffices as even/odd information. The column address decoder 23 is preferably organized in such a way that a single bit at a specific bit position "i" in the column address SAD selects the bank half. The "bank half bit" SAD[i] is usually the most significant bit (MSB) or the least significant bit (LSB) of the column address. For the exemplary embodiment described here, it shall be assumed that SAD[i] has the value "0" for columns of the even bank half and has the value "1" for columns of the odd bank half.

The bank multiplexer 50 contains only two n/2-pole changeover switches 51 and 52, which are both controlled by the less-significant bit BAD[0] of the bank address. If one of the two banks BK00, BK10 of the upper bank pair is addressed, then BAD[0] is logic "0" and the changeover switches 51 and 52 are in their 0 position. When one of the banks BK01, BK11 is addressed, BAD[0] is logic "1", and the changeover switches are in their 1 position.

The changeover switches 51 and 52 are disposed between the terminals of the changeover switch 40 and the bundles LDa, LDb, LDc and LDd in such a way that, during operation of the memory circuit, the assignments presented in Table 3 below are produced between the bank addressing, the clock signal edges and the writing or reading at the bank halves:

TABLE 3

| Bank address | 00 | | 00 | | 01 | | 01 | | 10 | | 10 | | 11 | | 11 | |
|---|---|---|---|---|---|---|---|---|---|---|---|---|---|---|---|---|
| Switches 51, 52 (BAD[0]) | 0 | | 0 | | 1 | | 1 | | 0 | | 0 | | 1 | | 1 | |
| Clock edge | Rising | | Falling | | Rising | | Falling | | Rising | | Falling | | Rising | | Falling | |
| CLH | 0 | | 1 | | 0 | | 1 | | 0 | | 1 | | 0 | | 1 | |
| Bank half bit SAD[i] | 0 | 1 | 0 | 1 | 0 | 1 | 0 | 1 | 0 | 1 | 0 | 1 | 0 | 1 | 0 | 1 |
| Switch 40 (USS) | 0 | 1 | 1 | 0 | 0 | 1 | 1 | 0 | 0 | 1 | 1 | 0 | 0 | 1 | 1 | 0 |
| Connection between EA and: | LDa | LDb | LDb | LDa | LDc | LDd | LDd | LDc | LDa | LDb | LDb | LDa | LDc | LDd | LDd | LDc |
| Writing or reading at BK *) | BK00 even | | BK00 odd | | BK01 even | | BK01 odd | | BK10 odd | | BK10 even | | BK11 odd | | BK11 even | |

It can be gathered from Table 3 that the binary switching signal USS is a logical XOR function (exclusive-OR function) of the bank half bit SAD[i] and the clock half signal CLH. Consequently, the combination circuit 25 may be a simple XOR gate, as shown in FIG. 3.

As can be seen from Table 3 and FIG. 3, the following holds true for the left-hand bank BK00 and BK01 in each bank pair BK00, BK10 or BK01, BK11: the input/output lines EA are connected to the read/write data lines LD of the even half of the addressed bank only in the event of a rising clock edge (CLH=0) if the addressed column belongs to the even bank half (SAD[i]=0). The input/output lines EA are connected to the read/write data lines LD of the odd half of the addressed bank only in the event of a falling clock edge (CLH=1) if the addressed column belongs to the odd bank half (SAD[i]=1).

The opposite holds true for the right-hand banks BK10 and BK11 of each bank pair: the input/output lines EA are connected to the read/write data lines LD of the odd half of the addressed bank only in the event of a rising clock edge (CLH=0) if the addressed column belongs to the odd bank half (SAD[i]=1). The input/output lines EA are connected to the read/write data lines LD of the even half of the addressed bank only in the event of a falling clock edge (CLH=1) if the addressed column belongs to the even bank half (SAD[i]=0).

This reversal of the operation of the left-hand bank relative to the operation of the right-hand bank is noncritical. This is because it is ensured, despite this reversal, that the same data which were written at any selected address via the input/output lines EA in the write mode in the event of a rising clock edge are in each case output on the input/output lines EA only in the event of a rising clock edge if the same address is selected during reading. In the same way, it is ensured that data which were written at any selected address via the input/output lines EA in the write mode in the event of a falling clock edge are output via the input/output lines EA only in the event of a falling clock edge when the same address is selected in the read mode.

The memory circuits shown in FIGS. 2 and 3 are only examples of different embodiments, which can also be modified, of course, without departing from the principle of the invention. If desired, the n-pole changeover switch 31 in the bank multiplexer 30 according to FIG. 2 can be replaced by a fixed n-pole junction, so that the central data lines are permanently connected to the other two n-pole changeover switches. As a result of this, although the central data lines are simultaneously connected to banks of all the pairs, a write or read mode is always affected only at the address bank. However, the loading on the data source is higher in the case of this variant. In a similar manner, the n/2-pole changeover switches 51 and 52 in the memory circuit according to FIG. 3 can be replaced in each case by a fixed n/2-pole junction.

The number of bank pairs may also be less than or greater than 2. If only a single bank pair is present, the central n-pole changeover switch 31 and one of the n-pole changeover switches 31, 32 are obviated in the embodiment according to FIG. 2; and the central data lines ZD are then permanently connected to the remaining single n-pole changeover switch. In the embodiment according to FIG. 3, the two n/2-pole changeovers switches 51 and 52 are obviated, and the two bundles of the data lines ZD are directly connected to the two bundles of the read/write data lines of the single bank pair. If more than two bank pairs are present, the changeover switch 31 in FIG. 2 or the changeover switches 51 and 52 in FIG. 3 are to be replaced by changeover switches which can assume more than two positions in order to be able to individually produce connections to the read/write data lines of each bank pair.

The multipole changeover switches are represented symbolically as mechanical changeover switches in the figures of the drawing in order to clearly show the switching functions. In reality, of course, electronic switching devices are involved, preferably using MOS field-effect transistors.

We claim:

1. A digital memory circuit, comprising:
   at least two pairs of adjacent banks having in each case a multiplicity of memory cells in each of said banks, said memory cells forming a matrix-type configuration of rows and columns and receiving and addressed by bank address signals, row address signals and column address signals;
   only two bundles of in each case n/2 read/write data lines connected to each pair of said adjacent banks, said two bundles of n/2 read/write data lines including a first bundle connected to a first half of a first bank and to a second half of a second bank and a second bundle connected to a second half of said first bank and to a first half of said second bank, said bundles of said n/2 read/write data lines coupled to said columns of different halves of a bank in order to be able to write in or read out at each bank half simultaneously n/2 data bits at n/2 simultaneously addressed columns;
   a bundle of n/2 input/output lines for inputting and outputting n/2 data bits in parallel form;

a control device receiving and responding to the bank address signals, the row address signals, the column address signals and a clock signal for producing data transfer paths between simultaneously addressed memory cells and assigned ones of said n/2 read/write data lines during a respective period of the clock signal; and a changeover device controlled in a manner dependent on the clock signal to connect said n/2 input/output lines to said n/2 read/write data lines coupled to said first half of an addressed bank during a first half-period of the clock signal and to said n/2 read/write data lines coupled to said second half of said addressed bank during a subsequent second half-period of the clock signal, said changeover device being changed over between different switching states to connect said n/2 input/output lines either to said first bundle or to said second bundle of n/2 said read/write data lines of at least a bank pair containing said addressed bank.

2. The memory circuit according to claim 1, wherein:
said changeover device contains:
   bundles of n/2 central data lines including a first bundle and a second bundle;
   a central n/2-pole changeover switch connected between said bundles of n/2 central data lines and said n/2 input/output lines, said central n/2-pole changeover switch connecting said input/output lines to said first bundle of n/2 central data lines in a first switching state and to said second bundle of n/2 central data lines in a second switching state;
   n-pole changeover switches connected between said bundles of n/2 central data lines and said bundles of said n/2 read/write data lines, one of said n-pole changeover switches provided for each of said bank pairs, said n-pole changeover switches controlled in a manner dependent on the bank address signals such that said n-pole changeover switches connect said first bundle of said n/2 central data lines to said first bundle of said n/2 read/write data lines of said addressed bank and simultaneously connects said second bundle of said n/2 central data lines to said second bundle of said n/2 read/write data lines of the addressed bank; and
said control device having a changeover control device receiving and responding to the clock signal for putting a first of said n-pole changeover switches into the first switching state during the first half-period of the clock signal and into the second switching state during the subsequent second half-period of the clock signal.

3. The memory circuit according to claim 2, further comprising an additional central n-pole changeover switch being controlled in a manner dependent on the bank addressing signals for connecting said bundles of said n/2 central data lines only to one of said n-pole changeover switches assigned to said bank pair containing said addressed bank.

4. The memory circuit according to claim 1, wherein:
said changeover device contains:
   bundles of n/2 central data lines including a first bundle and a second bundle;
   a central n/2-pole changeover switch connected between said bundles of n/2 central data lines and said n/2 input/output lines, said central n/2-pole changeover switch connecting said n/2 input/output lines to said first bundle of said n/2 central data lines in a first switching state and to said second bundle of said n/2 central data lines in a second switching state;
   a first connecting device for connecting said first bundle of said n/2 central data lines to said first bundle of said n/2 read/write data lines of at least said bank pair containing the addressed bank; and
   a second connecting device for connecting said second bundle of said n/2 central data lines to said second bundle of said n/2 read/write data lines of at least said bank pair containing said addressed bank; and
said control device has a changeover control device, said changeover control device receiving and responding to the clock signal and the column address signals for said addressed bank to put said central changeover switch into a first switching state during a first half-period of the clock signal if an addressed column is located in a first bank half, and into a second switching state if the addressed column is located in a second bank half, and to change over said central changeover switch into the respective other switching state during the second half-period of the clock signal.

5. The memory circuit according to claim 4, wherein:
said first connecting device is an n/2-pole changeover switch controlled in a manner dependent on bank addressing to connect said first bundle of said n/2 central data lines to said first bundle of said n/2 read/write data lines of only said bank pair containing said addressed bank; and
said second connecting device is an n/2-pole changeover switch controlled in a manner dependent on the bank addressing to connect said second bundle of said n/2 central data lines to said second bundle of said n/2 read/write data lines of only said bank pair containing said addressed bank.

6. The memory circuit according to claim 4, wherein:
a column address for all of said banks is binary-coded such that a binary logic value of a specific column address bit indicates whether the addressed column is located in the first or in the second half of said bank; and
said changeover control device has a signal transmitter responding to the clock signal for generating an output signal having a first logic value during the first half-period of the clock signal and a second logic value during the second half-period of the clock signal; and
said changeover control device further containing an XOR gate having a first input receiving a column address bit, a second input receiving the output signal of said signal transmitter, and an output outputting an output signal controlling said central changeover switch.

* * * * *